(12) United States Patent
Van Der Heijden et al.

(10) Patent No.: US 10,673,388 B2
(45) Date of Patent: Jun. 2, 2020

(54) BIAS CIRCUIT

(71) Applicant: NXP B.V., Eindhoven (NL)

(72) Inventors: Mark Pieter Van Der Heijden, Eindhoven (NL); Gerben Willem De Jong, Veldhoven (NL); Xin Yang, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/131,682

(22) Filed: Sep. 14, 2018

(65) Prior Publication Data

US 2019/0173432 A1 Jun. 6, 2019

(30) Foreign Application Priority Data

Dec. 5, 2017 (EP) ..................... 17205536

(51) Int. Cl.
*H03F 1/30* (2006.01)
*H03F 1/22* (2006.01)
*H03F 3/343* (2006.01)
*H03F 1/20* (2006.01)
*H03F 3/19* (2006.01)

(52) U.S. Cl.
CPC ............. *H03F 1/223* (2013.01); *H03F 1/20* (2013.01); *H03F 1/302* (2013.01); *H03F 3/19* (2013.01); *H03F 3/3432* (2013.01)

(58) Field of Classification Search
CPC ....................................... H03F 1/30
USPC .......................... 330/296, 285, 311
See application file for complete search history.

(56) References Cited

U.S. PATENT DOCUMENTS

| | | | |
|---|---|---|---|
| 6,778,016 B2 | 8/2004 | Luo | |
| 6,809,593 B1 * | 10/2004 | Newman | H03F 1/302 330/285 |
| 7,023,281 B1 | 4/2006 | Ali | |
| 7,242,252 B2 * | 7/2007 | Taylor | G05F 3/205 330/285 |
| 7,242,253 B2 * | 7/2007 | Motta | H03F 1/22 330/311 |
| 7,501,896 B2 * | 3/2009 | Ishikawa | H01L 27/0629 330/288 |
| 7,944,306 B2 * | 5/2011 | Prikhodko | H03F 1/0205 330/133 |
| 8,217,716 B2 * | 7/2012 | Tanaka | H03F 1/30 330/133 |
| 2007/0040613 A1 * | 2/2007 | Chow | H03F 1/301 330/296 |
| 2009/0108939 A1 | 4/2009 | Oishi | |

* cited by examiner

*Primary Examiner* — Henry Choe

(57) ABSTRACT

A bias circuit for a bipolar RF amplifier is described. The bias circuit includes a current source coupled to a bias network. The bias network supplies a base current to the transistors in the amplifier circuit of the bipolar RF amplifier. The bias circuit includes a buffer coupled to the bias network and to the bipolar RF amplifier. The buffer provides additional base current to the amplifier circuit of bipolar RF amplifier and sinks avalanche current generated by the amplifier circuit of the bipolar RF amplifier.

20 Claims, 5 Drawing Sheets

BIAS CIRCUIT

CROSS-REFERENCE TO RELATED APPLICATIONS

This application claims the priority under 35 U.S.C. § 119 of European Patent application no. 17205536.0, filed on 5 Dec. 2017, the contents of which are incorporated by reference herein.

FIELD

This disclosure relates to a bias circuit for an RF bipolar amplifier.

BACKGROUND

Bipolar Power amplifiers operating at very high frequencies for example mm-wave frequencies usually include bipolar transistors with very low breakdown voltages. To operate at Watt-level, power combining techniques are employed in combination with stacking transistors to increase the voltage-handling capability and to increase the load-line. In one example, a power amplifier may have a cascode configuration including a stack of a low-voltage common-emitter (CE) stage and a low- or high-voltage common-base (CB) stage. The common-emitter stage includes one or more bipolar transistors in a common-emitter configuration which may be referred to as common-emitter transistors. The common-base stage typically includes one or more transistors in a common-base configuration which may also be referred to as common-base transistors. Alternatively, a power amplifier may have a common-emitter stage which includes one or more bipolar transistors in a common-emitter configuration which may be referred to as common-emitter transistors.

SUMMARY

Various aspects of the disclosure are defined in the accompanying claims. In a first aspect, there is provided a bias circuit for an RF bipolar amplifier, the bias circuit comprising a first bias circuit terminal configured to be coupled to the base of a transistor in the RF bipolar amplifier, a current source, a bias network coupled to the current source and the first bias terminal; and a buffer amplifier having an input coupled to the current source and an output coupled to the first bias circuit terminal; wherein the buffer amplifier is configured to at least partially source current provided to the first bias circuit terminal and to sink current from the first bias circuit terminal; and wherein the bias network is configured to provide a current to the first bias circuit terminal.

In one or more embodiments, the bias circuit may further comprise a second bias terminal coupled to the bias network, wherein the first bias circuit terminal is configured to be coupled to the base of a common-base transistor of a RF bipolar amplifier and the second bias circuit terminal is configured to be coupled to the base of a common-emitter transistor of the RF bipolar amplifier and wherein the bias network is configured to provide a current to the second bias circuit terminal.

In one or more embodiments, the bias circuit may further comprise a first bias transistor, a second bias transistor, and a third bias transistor, wherein the first bias transistor and third bias transistor is arranged in a cascode stack between a bias supply voltage rail and a common supply rail, the first bias transistor having a base coupled to the first bias circuit terminal and the third bias transistor having a base coupled to the second bias circuit terminal; and the second bias transistor has a base coupled to the first bias transistor base, an emitter coupled to the third bias transistor base and the common supply rail, and a collector coupled to the current source.

In one or more embodiments, the bias circuit may further comprise a first bias resistor arranged between the third bias transistor base and the second bias circuit terminal and a series arrangement of a second bias resistor and a third bias resistor arranged between the third bias transistor emitter and the common supply rail wherein the third bias transistor base is coupled to a common node between the second bias resistor and the third bias resistor.

In one or more embodiments, the bias network comprises a bias transistor having a collector coupled to the current source and the buffer amplifier input, an emitter coupled to the common supply rail, a bias resistor arranged between the bias transistor base and the first bias terminal, and a capacitor arranged between the bias transistor collector and the bias transistor base.

In one or more embodiments, the buffer amplifier may further comprise a current sourcing transistor having a base coupled to the buffer amplifier input and an emitter coupled to the buffer amplifier output, a current sink arranged between the buffer amplifier output and common supply rail.

In one or more embodiments, the buffer amplifier may further comprise a level shifter having a first terminal coupled to the current sourcing transistor collector and wherein the current sink comprises a current sinking transistor having a base coupled to a second terminal of the level shifter, a collector coupled to the first bias transistor base and an emitter coupled to the common supply rail.

In one or more embodiments, the level shifter comprises a series arrangement of at least two diodes and a resistor coupled between current sourcing transistor collector and the common supply rail, and wherein the current sinking transistor base is coupled to a common node of one of the at least two diodes and the resistor.

In one or more embodiments, the buffer amplifier may further comprise a current source element arranged between the bias supply voltage rail and the current sourcing transistor collector.

In one or more embodiments, the current source element may comprise a resistor.

In one or more embodiments, the buffer amplifier may further comprise a clamp transistor arranged in parallel with the current source element.

In one or more embodiments, the buffer amplifier may further comprise a class AB amplifier.

In one or more embodiments, the buffer amplifier may further comprise an output stage including a series arrangement of a current sourcing transistor and a current sinking transistor between the bias supply voltage rail and the common supply rail; a series arrangement of an input transistor and a level-shift diode between the bias supply voltage rail and the current sink transistor; wherein the first bias transistor base is coupled to the current sourcing transistor emitter and the current sinking transistor emitter, and the first bias transistor collector is coupled to the current sourcing transistor base and the input transistor base.

Embodiments of the bias circuit may be included in a bipolar RF amplifier including an amplifier circuit coupled to the bias circuit.

The amplifier circuit may comprise a cascode arrangement of a common base stage, and a common emitter stage;

an input coupled to the common emitter stage; an output coupled to the common base stage.

In the figures and description like reference numerals refer to like features. Embodiments of are now described in detail, by way of example only, illustrated by the accompanying drawings in which.

DESCRIPTION

Figure 1A:
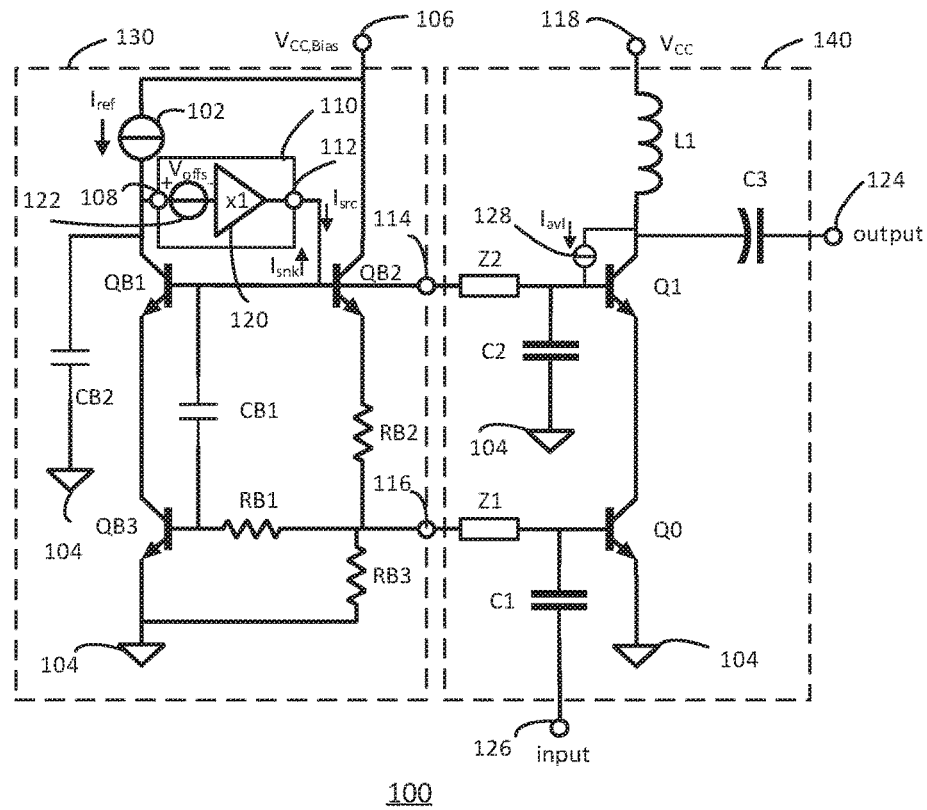
FIG. 1A shows an RF bipolar amplifier including a bias circuit according to an embodiment.

FIG. 1 shows an RF bipolar power amplifier 100 including a bias circuit 130 and an amplifier circuit 140 according to an embodiment. The transistors illustrated in FIG. 1 are NPN bipolar transistors. Other examples may use PNP transistors or a mix of PNP and NPN bipolar transistors.

The bias circuit 130 may include a bias current source 102, a buffer amplifier 110, a first bias transistor QB1, a second bias transistor QB2, a third bias transistor QB3. The bias circuit 130 may include a first bias capacitor CB1, a second bias capacitor CB2. The bias circuit 130 may include a first bias circuit resistor RB1, a second bias circuit resistor RB2 and a third bias circuit resistor RB3.

The bias current source 102 may be connected between a bias supply voltage rail 106 and the collector of a first bias transistor QB1. The buffer amplifier 110 may have a buffer amplifier input 108 connected to the collector of the first bias transistor QB1. The buffer amplifier 110 may have a buffer amplifier output 112 connected to the base of the first bias transistor QB1. The buffer amplifier output 112 may be connected to the base of a second bias transistor QB2. The buffer amplifier output 112 may be connected to a first bias circuit terminal or node 114.

The first bias resistor RB1 may have a first terminal connected to a second bias circuit terminal or node 116. The first bias resistor RB1 may have a second terminal connected to the base of a third bias transistor QB3.

The second bias transistor QB2 may have a collector connected to the bias supply voltage rail 106 and an emitter connected to a first terminal of second bias resistor RB2. A second terminal of the second bias resistor RB2 may be connected to a second bias circuit terminal or node 116. A first terminal of third bias resistor RB3 may be connected to the second bias circuit terminal 116. A second terminal of the third bias resistor RB3 may be connected to a common supply rail 104 which may be a ground.

The first bias capacitor CB1 may be connected between the base of the first bias transistor QB1 and the base of the third bias transistor QB3. The collector of the third bias transistor QB3 may be connected to the emitter of first bias transistor QB1. The second bias capacitor CB2 may be connected between the collector of the first bias transistor QB1 and the common supply rail 104.

The amplifier circuit 140 may include a common-emitter (CE) transistor Q0, a common-base (CB) transistor Q1, an input AC coupling capacitor C1, an AC-coupling capacitor C2, an output AC coupling capacitor C3, first impedance element Z1, a second impedance element Z2, and an inductance L1. The ac-coupling capacitors C1, C2, C3 may also be referred to as DC-blocking capacitors.

The first impedance element Z1 may be connected between the second bias output terminal 116 and the base of the CE transistor Q0. Input AC coupling capacitor C1 may be connected between the base of the CE transistor Q0 and the RF amplifier input 126. The emitter of CE transistor Q0 may be connected to the common supply rail 104. The collector of CE transistor Q0 may be connected to the emitter of the CB transistor Q1.

The second impedance element Z2 may be connected between the first bias output terminal 114 and the base of the CB transistor Q1. AC coupling capacitor C2 may be connected between the base of the CB transistor Q1 and common supply rail 104. The inductance L1 may be connected between an amplifier supply rail 118 and the collector of common base transistor Q1. The amplifier supply rail 118 may supply a voltage $V_{CC}$. The output capacitor C3 may be connected between a collector of common base transistor Q1 and the RF amplifier output 124. First impedance element Z1 and second impedance element Z2 are connecting impedance elements with inductive and/or resistive elements and may have complex impedance values of $Z1(=R1+jX1)$ and $Z2(=R2+jX2)$ where R1 and R2 are the values of the DC resistance and X1 and X2 are the reactance values of the respective impedance element.

The amplifier circuit 140 has a cascode configuration of a low-breakdown-voltage common-emitter transistor Q0 and a low or high break-down voltage common-base transistor Q1. A low voltage may for example be a voltage in the range of 1 to 2.5 volts and a high voltage may for example be a voltage in the range of 2.5 and 5 volts or greater than 5 volts. The common-base transistor Q1 may be operated typically at 3.5 volts. In other examples, the amplifier circuit 140 may have multiple stages of common-emitter transistors and/or common-base transistors dependent on the required power output. Input capacitor C1 is used to feed the RF signal to the base of Q0. The AC decoupling capacitor C2 may be used to ground the base of Q1 at RF to mm Wave frequencies which may be in the range of 100 MHz to greater than 300 GHz. The inductance L1 and output capacitor C3 may provide the required impedance matching for an output load connected to the RF amplifier output 124.

In operation, the bias supply rail 106 may supply a bias voltage $V_{CC,Bias}$. The bias current source 102 which may be for example a resistor coupled to the bias supply rail 106 determines the value of the reference current Iref. First bias transistor QB1, second bias transistor QB2, third bias transistor QB3, second bias resistor RB2, and third bias resistor RB3 form a self-biased cascode bias network to bias common-base transistor Q1 of the cascode of the amplifier circuit 140. The collector current of first bias transistor QB1 may provide the base current for both the first bias transistor QB1 and the third bias transistor QB3. Consequently, by using a cascode arrangement of first bias transistor QB1 and third bias transistor QB3 in the bias circuit, the power consumption of the RF power amplifier 100 may be reduced. In some examples, the bias supply rail 106 and the amplifier supply rail 118 may be connected to the same voltage source so that $V_{CC,Bias}$ is equal to $V_{CC}$. In other examples, the supply voltages may be different.

The transistor QB3, first bias resistor RB1, and first impedance element Z1, forms a current mirror together with common-emitter transistor Q0. The resistor RB1 may be chosen to have a fixed ratio N with respect to the resistance value R1 of the first impedance element Z1. The value of current copied by the current mirror from QB3 to Q0 is Iref*N, where Iref is the reference current from the current source 102.

The first bias capacitor CB1 may improve circuit stability by pole splitting of the bias circuit. The second bias capacitor CB2 may help stabilize the circuit operation, by storing excess charge so that Iref remains constant. Capacitor CB2 may also filter noise from the incoming reference current Iref. In some examples, CB2 may be omitted. It will be understood that, in other examples, the capacitors may be positioned at different nodes in the circuit than illustrated in RF amplifier 100 to stabilize the circuit operation.

The buffer amplifier 110 may include a level shifter 122 and a unity voltage-gain buffer 120. The buffer amplifier 110 may provide additional current sourcing $I_{src}$, and current sinking $I_{snk}$ for the base current supplied to or generated from CB transistor Q1. The buffer amplifier 110 may be considered as a beta helper for CB transistor Q1, first bias transistor QB1 and second bias transistor QB2.

During operation of the RF amplifier 100, in order to maximize the available voltage head-room of the cascode configuration of transistors Q0 and Q1, the collector-emitter voltage ($V_{ce}$) of the CB transistor Q1 may be operated beyond the collector breakdown voltage with open base (BVCEO). This means that Q1 may be biased at, or just above BVCEO under nominal power amplifier operating conditions and under extreme loading conditions.

When CB transistor Q1 is biased beyond BVCEO, the avalanche current $I_{avl}$, illustrated as current source 128, that flows from the collector to the base of CB transistor Q1 is equal or bigger than the forward base current of CB transistor Q1. Consequently, the net base current of CB transistor Q1 reverses sign and flows back into the cascode bias circuit 130. This increase in base current increases the base voltage of CB transistor Q1. The emitter of CB transistor Q1 follows the increase in base voltage. As the base of the second bias transistor QB2 is coupled to the base of the CB transistor Q1, the emitter of the second bias transistor QB2 also follows the increase in base voltage of the CB transistor Q1. Consequently, via the second bias resistor RB2 and the first impedance element Z1, the base-emitter voltage of CE transistor Q0 increases and hence the collector current Ic in the cascode increases. This increase in collector current results in further avalanche multiplication, leading eventually to failure of the device.

The inventors of the present disclosure have appreciated that by including the buffer amplifier 110 in the bias circuit with both current sourcing and current sinking capability, a low-impedance voltage output at the base of first bias transistor QB1 and the second bias transistor QB2 may be provided under all operating conditions. Furthermore, since any avalanche current generated by CB transistor Q1 may flow to the common supply rail 104 via the buffer amplifier 110, the risk of failure of the device may be reduced.

Figure 1B:
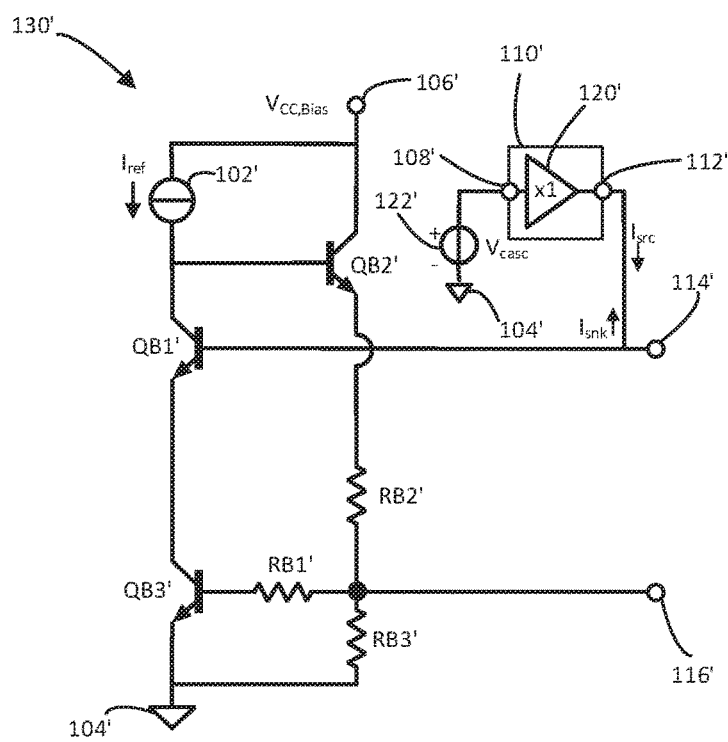
FIG. 1B shows a bias circuit for an RF bipolar amplifier according to an embodiment.

FIG. 1B shows a bias circuit 130' that may be used as an alternative to bias circuit 130 in FIG. 1A.

The bias circuit 130' may include a bias current source 102', a buffer amplifier 110', a first bias transistor QB1', a second bias transistor QB2', a third bias transistor QB3'. The bias circuit 130' may include a first bias circuit resistor RB1', a second bias circuit resistor RB2' and a third bias circuit resistor RB3'.

The bias current source 102' may be connected between a bias supply voltage rail 106' and the collector of a first bias transistor QB1'. A voltage reference 122 may be connected between a buffer amplifier input 108' and a common supply rail 104'. The buffer amplifier 110' may have a buffer amplifier output 112' connected to the base of the first bias transistor QB1'. The buffer amplifier output 112' may be connected to a first bias circuit terminal 114'.

A first bias resistor RB1' may have a first terminal connected to the second bias circuit terminal 116'. The first bias resistor RB1' may have a second terminal connected to the base of a third bias transistor QB3'.

The second bias transistor QB2' may have a collector connected to the bias supply voltage rail 106' and an emitter connected to a first terminal of second bias resistor RB2'. The second bias transistor QB2' may have a base connected to the collector of the first bias transistor QB1'. A second terminal of the second bias resistor RB2' may be connected to the second bias circuit terminal 116'. A first terminal of third bias resistor RB3' may be connected to the second bias circuit terminal 116'. A second terminal of the third bias resistor RB3' may be connected to a common supply rail 104' which may be a ground.

In operation, the bias circuit 130' may be connected to a cascode amplifier circuit 140 illustrated in FIG. 1A. The bias supply rail 106 may supply a bias voltage $V_{CC,Bias}$ the bias current source 102' which may be for example a resistor coupled to the bias supply rail 106 determines the value of the reference current Iref. First bias transistor QB1', second bias transistor QB2', third bias transistor QB3', second bias resistor RB2', and third bias resistor RB3' form a self-biased cascode bias network to bias common-emitter transistor Q0' of the cascode of the amplifier circuit. The bias voltage at the base of common-base transistor QB1' and common-base transistor Q1 may be determined by the value of the voltage Vcasc of the voltage source 122 via the buffer amplifier 110'.

The transistor QB3', first bias resistor RB1', and first impedance element Z1, forms a current mirror together with common-emitter transistor Q0. The resistor RB1' may be chosen to have a fixed ratio N with respect to the resistance value R1 of the first impedance element Z1. The value of current copied by the current mirror from QB3' to Q0' is Iref N, where Iref is the reference current from the current source 102'.

The buffer amplifier 110' may include a level shifter 122' and a unity voltage-gain buffer 120'. The buffer amplifier 110' may provide additional current sourcing $I_{src}$, and current sinking $I_{snk}$ for the base current supplied to or generated from CB transistor Q1 in the cascode amplifier 140. The buffer amplifier 110 may be considered as a beta helper for CB transistor Q1.

Figure 2:
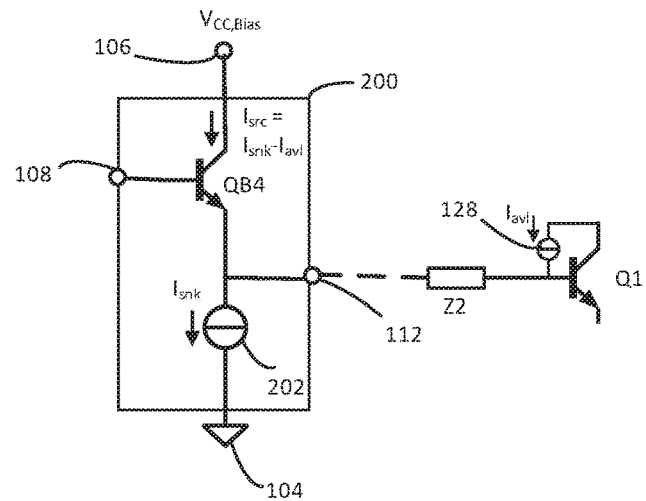
FIG. 2 illustrates a buffer amplifier for an RF bipolar amplifier bias circuit according to an embodiment.

FIG. 2 shows a buffer amplifier 200 for a bias circuit according to an embodiment. The buffer amplifier 200 may for example be used instead of buffer amplifier 110 in bias circuit 130. The transistors illustrated in FIG. 2 are NPN bipolar transistors. Other examples may use PNP transistors or a mix of PNP and NPN bipolar transistors.

The buffer amplifier 200 includes a current sourcing transistor QB4 configured as an emitter-follower and a current sink 202. The current sourcing transistor QB4 may have a collector connected to the bias supply rail 106. The current sourcing transistor QB4 may have an emitter connected to the buffer amplifier output 112. The current sourcing transistor QB4 may have a base connected to the buffer amplifier input 108. The current sink 202 may have a first terminal connected to the emitter of the current source transistor QB4. The current sink 202 may have a second terminal connected to the emitter of the current source transistor QB4.

In operation, the current sourcing transistor QB4 operates as class-AB voltage buffer which may act as a beta-helper to source base current to the CB transistor Q1. For avalanche current, the fixed current sink 202, which may be a resistor, may sink avalanche current $I_{avl}$ generated by the CB transistor Q1 via the second impedance element Z2. The current sink 202 is passive and therefore fixed to the maximum negative base current that is expected from CB transistor Q1 which may result in increased power dissipation.

Figure 3:
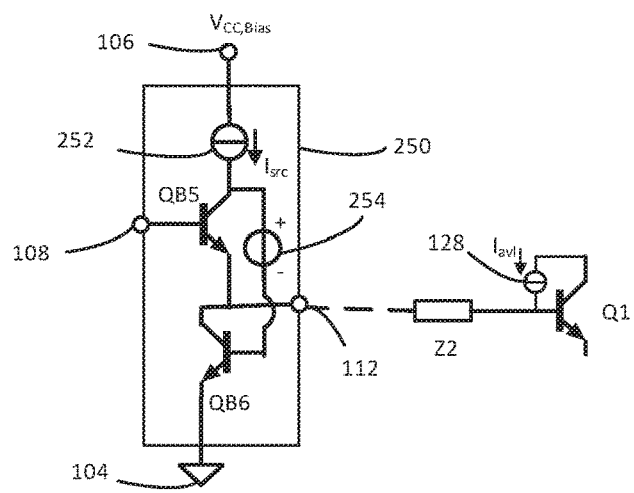
FIG. 3 shows a buffer amplifier for an RF bipolar amplifier bias circuit according to an embodiment.

FIG. 3 shows an example buffer amplifier 250 which may be used instead of buffer amplifier 110 in the bias circuit 130. The transistors illustrated in FIG. 3 are NPN bipolar transistors. Other examples may use PNP transistors or a mix of PNP and NPN bipolar transistors.

The buffer amplifier 250 may include a current sourcing transistor QB5, a current sinking transistor QB6, a level shifter 254, and a current source 252 which may be for example a resistor. The current sourcing transistor QB5 may have a collector connected to a first terminal of the current source 252. A second terminal of the current source may be connected to the bias supply rail 106. The current sourcing transistor QB5 may have an emitter connected to the buffer amplifier output 112. The current sourcing transistor QB5 may have a base connected to the buffer amplifier input 108. A current sinking transistor QB6 may have a collector connected to the buffer amplifier output 112. The current sinking transistor QB6 may have an emitter connected to the common supply rail 104. A level shifter 254 may be connected between the collector of the current sourcing transistor QB5 and the base of the current sinking transistor QB6.

In operation, the current source 252 may supply a current $I_{src}$. If avalanche current $I_{avl}$ is generated by CB transistor Q1, this may flow into the bias network (not shown) and buffer amplifier 250 from CB transistor Q1 and into the buffer amplifier 250 via buffer amplifier output 112. The avalanche current $I_{avl}$ may decrease the collector current in current sourcing transistor QB5 by an amount $I_{src}-I_{avl}$. The decrease in collector current results in an increase of the collector voltage of current sourcing transistor QB5. Via level shift 254, the base-emitter voltage of current sinking transistor QB6 increases and sinks the net base current of CB transistor Q1 to the common supply rail 104 which may be a ground. By sinking the net base current, the base bias voltage of CB transistor Q1 may be stabilized. The forward base-current of common base transistor Q1 is now limited by current $I_{src}$ from the current source 252. However, this is usually a much lower current than that is required in the avalanche protection mode.

Figure 4:
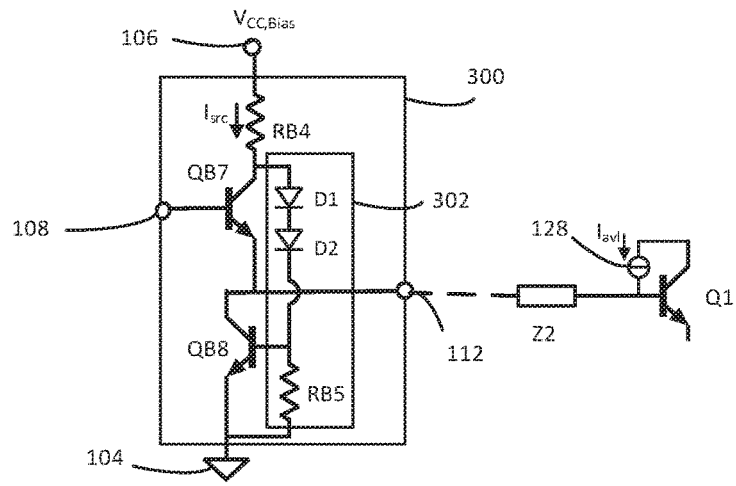
FIG. 4 illustrates a buffer amplifier for an RF bipolar amplifier bias circuit according to an embodiment.

FIG. 4 shows an example buffer amplifier 300 which may be used instead of buffer amplifier 110 in the bias circuit 130. The transistors illustrated in FIG. 4 are NPN bipolar transistors. Other examples may use PNP transistors or a mix of PNP and NPN bipolar transistors.

The buffer amplifier 300 may include a current sourcing transistor QB7, a current sinking transistor QB8, a level shifter 302, and a current source resistor RB4. The current sourcing transistor QB7 may have a collector connected to a first terminal of the current source resistor RB4. A second terminal of the current source resistor RB4 may be connected to the bias supply rail 106. The current sourcing transistor QB7 may have an emitter connected to the buffer amplifier output 112. The current sourcing transistor QB7 may have a base connected to the buffer amplifier input 108. The current sinking transistor QB8 may have a collector connected to the buffer amplifier output 112. The current sinking transistor QB8 may have an emitter connected to the common supply rail 104. The level shifter 302 may include a series arrangement of diode D1, diode D2 and level shifter resistor RB5 connected between the collector of the current sourcing transistor QB7 and the common supply rail 104. The common node between diode D2 and the level shifter resistor RB5 may be connected to the base of the current sinking transistor QB8.

In operation, the bias supply rail may supply a voltage denoted $V_{CC,Bias}$. The current source resistor RB4 may supply a current $I_{src}$. If avalanche current $I_{avl}$ is generated by CB transistor Q1, this may flow into the bias network (not shown) from CB transistor Q1 and into the buffer amplifier 300 via buffer amplifier output 112. The avalanche current $I_{avl}$ may decrease the collector current in current sourcing transistor QB7 by an amount $I_{src}-I_{avl}$. The decrease in collector current results in an increase of the collector voltage of current sourcing transistor QB7. Via level shift 302, the base-emitter voltage of current sinking transistor QB8 increases and sinks the net base current of CB transistor Q1 to the common supply rail 104 which may be ground. By sinking the net base current, the base bias voltage of CB transistor Q1 may be stabilized. The forward base-current of common base transistor Q1 is now limited by current $I_{src}$ from the current source resistor RB4. However, this is usually a much lower current than that is required in the avalanche protection mode.

Figure 5:
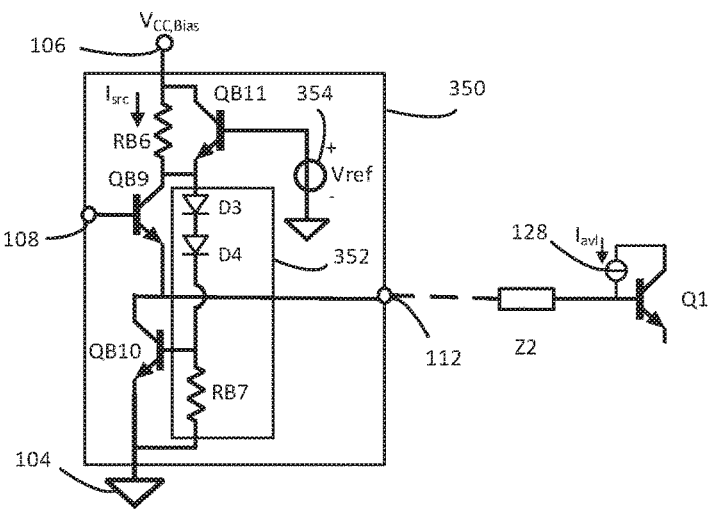
FIG. 5 shows a buffer amplifier for an RF bipolar amplifier bias circuit according to an embodiment.

FIG. 5 shows an example buffer amplifier 350 which may be used instead of buffer amplifier 110 in the bias circuit 130. The transistors illustrated in FIG. 4 are NPN bipolar transistors. Other examples may use PNP transistors or a mix of PNP and NPN bipolar transistors.

The buffer amplifier 350 may include a current sourcing transistor QB9, a current sinking transistor QB10, a level shifter 352, a current source resistor RB6, A clamp transistor QB11, and a voltage reference 354. The current sourcing transistor QB9 may have a collector connected to a first terminal of the current source resistor RB6. A second terminal of the current source resistor RB6 may be connected to the bias supply rail 106. The current sourcing transistor QB9 may have an emitter connected to the buffer amplifier output 112. The current sourcing transistor QB9 may have a base connected to the buffer amplifier input 108. The current sinking transistor QB10 may have a collector connected to the buffer amplifier output 112. The current sinking transistor QB10 may have an emitter connected to the common supply rail 104. The level shifter 352 may include a series arrangement of diode D3, diode D4 and level shifter resistor RB7 connected between the collector of the current sourcing transistor QB9 and the common supply rail 104. The common node between diode D4 and the level shifter resistor RB7 may be connected to the base of the current sinking transistor QB10.

In operation, the bias supply rail may supply a voltage denoted $V_{CC,Bias}$. The current source resistor RB6 may supply a current $I_{src}$. If avalanche current $I_{avl}$ is generated by CB transistor Q1, this may flow into the bias network (not shown) from CB transistor Q1 and into the buffer amplifier 350 via buffer amplifier output 112. The avalanche current $I_{avl}$ may decrease the collector current in current sourcing transistor QB9 by an amount $I_{src}-I_{avl}$. The decrease in collector current results in an increase of the collector voltage of current sourcing transistor QB9. Via level shift 352, the base-emitter voltage of current sinking transistor QB10 increases and sinks the net base current of common-base transistor Q1 to the common supply rail 104 which may be ground. By sinking the net base current, the base bias voltage of CB transistor Q1 may be stabilized. The clamp transistor QB11 across the current source resistor may protect current source QB9 from saturation under extreme operating conditions. Extreme operating conditions may be caused for example by a high voltage standing wave ratio (VSWR) condition on an antenna connected to the RF amplifier output. This VSWR condition may cause a load mismatch for the CB transistor Q1 resulting in a large increase in base current. The voltage reference 354 may have a reference voltage of 4-diode drop voltages or slightly higher so that the base emitter junction of clamp transistor QB11 is always forward biased. The voltage clamp formed by clamp transistor QB11 and voltage reference 354 may limit the voltage drop across current source resistor RB6 and prevent the current sourcing transistor QB9 going into saturation when forward current exceeding the quiescent current of the current sourcing transistor QB9 is required to be sourced to the base of the common-base transistor Q1. Preventing the current sourcing transistor QB9 going into saturation in this way may result in less variation in the bias voltage supplied due to differences in processing of the transistor during manufacturing, supply voltage differences and temperature variations. In buffer amplifier 350, the forward base-current required by common base transistor Q1 is no longer limited by current $I_{src}$ from the current source resistor RB6. In some examples, the single current sourcing transistor QB9 may be replaced by a Darlington pair configuration of two transistors which effectively acts as a single transistor with a higher current gain or beta value.

Figure 6:
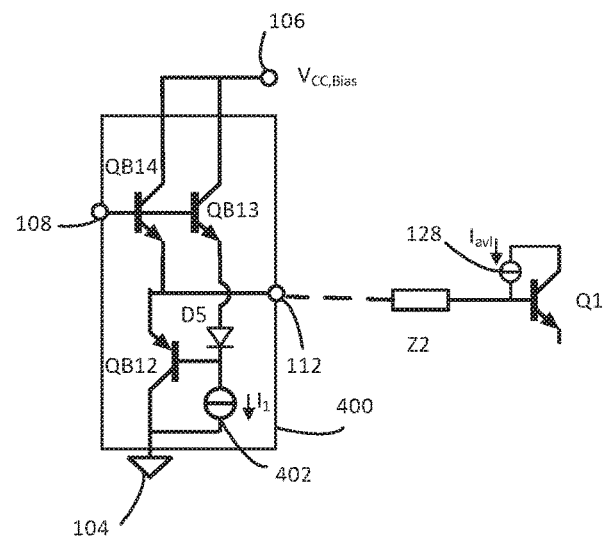
FIG. 6 shows a buffer amplifier for an RF bipolar amplifier bias circuit according to an embodiment.

FIG. 6 shows an example buffer amplifier 400 which may be used instead of buffer amplifier 110 in the bias circuit 130. The buffer amplifier 400 may include a complementary class-AB output stage including current sourcing transistor QB14 and a current sinking transistor QB12. The buffer amplifier 400 may further include an input transistor QB13, level-shift diode D5 and current source 402. The current sourcing transistor QB14 and input transistor QB13 are NPN bipolar transistors. The current sinking transistor QB12 is a PNP transistor.

The current sourcing transistor QB14 may have a collector connected to the bias supply rail 106. The current sourcing transistor QB14 may have an emitter connected to the buffer amplifier output 112. The current sourcing transistor QB14 may have a base connected to the buffer amplifier input 108. The collector of the input transistor QB13 may be connected to the bias supply rail 106. The base of the input transistor QB13 may be connected to the buffer amplifier input 108.

The current sinking transistor QB12 may have an emitter connected to the buffer amplifier output 112. A series arrangement of level-shift diode D5 and current source 402 may be connected between the emitter of the input transistor QB13 and the common supply rail 104. The common node between level-shift diode D5 and the current source 402 may be connected to the base of the current sinking transistor QB12.

In operation, the bias supply rail may supply a voltage denoted $V_{CC,Bias}$. The source current is supplied to the buffer output 112 by the current sourcing transistor QB14 and so supplies base current to CB transistor Q1. If avalanche current $I_{avl}$ is generated by CB transistor Q1, this may flow into the bias network (not shown) from CB transistor Q1 and into the buffer amplifier 400 via buffer amplifier output 112. The current sinking transistor QB12 acts as a complementary beta-helper for CB transistor Q1 and acts as a current sink for the generated avalanche current from CB transistor Q1. The base of the current sinking transistor QB12 is controlled by the input transistor QB13 and the level-shift diode D5. In some examples, the level-shift diode D5 may be implemented using a transistor with a base connected to the collector. In this case, the quiescent current of the buffer amplifier may be determined by the current source 402 which may be a resistor and the emitter-area ratios QB14/QB13 and QB12/D5. In buffer amplifier 400, the current limits of sourcing and sinking is not fixed by any current source.

Figure 7:
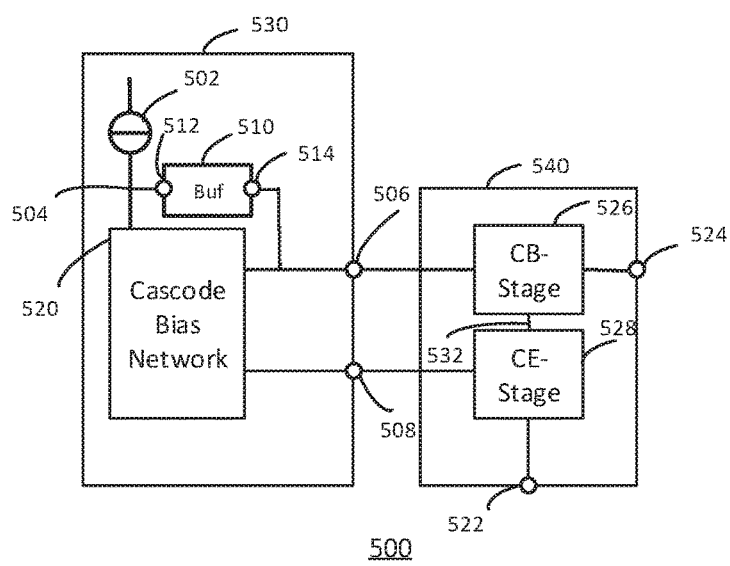
FIG. 7 shows an RF bipolar amplifier including a bias circuit according to an embodiment.

FIG. 7 shows an RF bipolar amplifier 500 according to an embodiment. RF amplifier includes a bias circuit 530 and an RF cascode amplifier circuit 540.

The bias circuit 530 includes a cascode bias network 520, a buffer amplifier 510 and a current source 502. The current source 502 may have a connection 504 to the cascode bias network 520. The current source 502 may have a connection 504 to the buffer amplifier input 512. The buffer amplifier output 514 may be connected to a first bias terminal 506. The cascode bias network 520 may be connected to the first bias terminal 506 and a second bias terminal 508.

The RF amplifier circuit 540 may include a common-emitter stage 528 including one or more bipolar transistors in a common-emitter configuration. The RF amplifier circuit 540 may include a common-base stage 526 including one or more bipolar transistors in a common-base configuration. The common-base stage 526 may be connected to the RF amplifier output 524. The common-emitter stage 528 may be connected to the RF amplifier input 522. The common-emitter stage 528 may be connected via connection 532 to the common-base stage 526. The common-base stage 526 and the common-emitter stage 528 may be arranged in a cascode configuration.

The first bias terminal 506 may be connected to one or more of the bases of the transistors in the common-base stage 526. The second bias terminal 508 may be connected to one or more of the bases of the transistors in the common-emitter stage 528.

In operation, the cascode bias network 520 may supply the base current for the transistors in the common-base stage 526 via first bias terminal 506. The cascode bias network 520 may supply the base current for the transistors in the common-emitter stage 528 via second bias terminal 508. The buffer amplifier 510 may provide additional base current to the common-base stage 526. The buffer amplifier 510 may sink avalanche current generated from the common-base stage 526. The buffer amplifier 510 may source and sink base currents to and from the common-base stage 526 in the presence of avalanche currents under nominal and extreme loading conditions. Consequently, the buffer amplifier 510 may stabilize the bias supply to the RF amplifier circuit 540 and prevent the cascode arrangement of the common-base stage 526 and the common-emitter stage 528 from breakdown.

It will be appreciated that the buffer amplifier 510 may be implemented by any of the buffer amplifiers 200, 250, 300, 350, 400.

Figure 8:
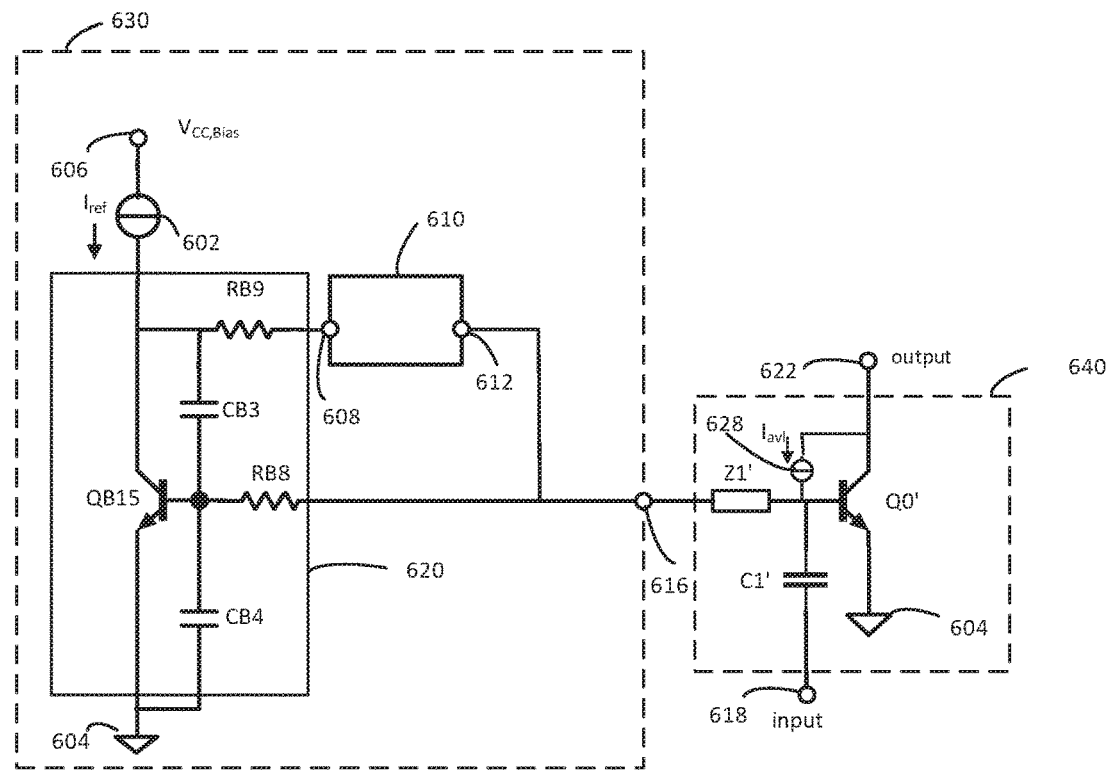
FIG. 8 shows an RF bipolar amplifier including a bias circuit according to an embodiment.

FIG. 8 shows an RF bipolar power amplifier 600 including a bias circuit 630 and an amplifier circuit 640 according to an embodiment. The transistors illustrated in FIG. 8 are NPN bipolar transistors. Other examples may use PNP transistors or a mix of PNP and NPN bipolar transistors. It will be appreciated that the transistors may be formed on different semiconductor substrates such as Silicon, GaAs, GaN and other suitable materials The bias circuit 630 may include a bias current source 602, a buffer amplifier 610, and a bias network 620. The bias network 620 may include a bias transistor QB15, a first bias capacitor CB3, a second bias capacitor CB4, a first bias resistor RB8, and a second bias resistor RB9.

The bias current source 608 may be connected between a bias supply voltage rail 606 and the collector of a first bias transistor QB15. The buffer amplifier 610 may have a buffer amplifier input 608 connected to the collector of the first bias transistor QB15. The buffer amplifier 610 may have a buffer amplifier output 612 connected to bias circuit terminal 616.

The first bias resistor RB8 may have a first terminal connected to the bias circuit terminal 616. The first bias resistor RB8 may have a second terminal connected to the base of the bias transistor QB15. The second bias resistor RB9 may have a first terminal connected to the collector of the bias transistor QB15. The second bias resistor RB8 may have a second terminal connected to the buffer amplifier input 608.

The first bias capacitor CB3 may have a first terminal connected to the base of the bias transistor QB15 and a second terminal connected to the collector of the bias transistor QB15. The second bias capacitor CB4 may have a first terminal connected to the base of the bias transistor QB15 and a second terminal connected to the emitter of the bias transistor QB15. The emitter of the bias transistor QB15 may be connected to a common supply rail 604 which may be a ground. In some examples, the second bias resistor RB9 may be omitted. In some examples, if the base-emitter capacitance of bias transistor is sufficient, the second bias capacitor CB4 may be omitted. In some examples, the first bias resistor RB8 may be omitted. In some examples, if the base-collector capacitance of bias transistor is sufficient, the first bias capacitor CB4 may be omitted.

The amplifier circuit 640 may include a common-emitter (CE) transistor Q0', an input AC coupling capacitor C1', and an impedance element Z1'.

The impedance element Z1' may be connected between the bias output terminal 616 and the base of the CE transistor Q0'. Input AC coupling capacitor C1' may be connected between the base of the CE transistor Q0' and the RF amplifier input 618. The emitter of CE transistor Q0' may be connected to the common supply rail 604. The collector of CE transistor Q0' may be connected to the RF amplifier output 622.

The amplifier circuit 640 may have a low or high breakdown voltage common-emitter transistor Q0'. A low voltage may for example be a voltage in the range of 1 to 2.5 volts and a high voltage may for example be a voltage in the range of 2.5 and 5 volts or greater than 5 volts. In other examples, the amplifier circuit 640 may have multiple stages of common-emitter transistors dependent on the required power output. Input capacitor C1' is used to feed the RF signal to the base of Q0'.

In operation, the bias supply rail 606 may supply a bias voltage $V_{CC,Bias}$. The bias current source 608 which may be for example a resistor coupled to the bias supply rail 606 determines the value of the reference current Iref.

The transistor QB15, first bias resistor RB8, and first impedance element Z1', forms a current mirror together with common-emitter transistor Q0'. The resistor RB8 may be chosen to have a fixed ratio N with respect to the resistance value R1' of the first impedance element Z1'. The value of current copied by the current mirror from QB3 to Q0 is Iref N, where Iref is the reference current from the current source 608.

The first bias capacitor CB3 and CB4 may improve circuit stability of the bias circuit 630. In some examples, the capacitors CB3 and CB4 may be omitted. It will be understood that, in other examples, the capacitors may be positioned at different nodes in the circuit than illustrated in RF amplifier 600 to stabilize the circuit operation.

The buffer amplifier 610 may provide additional current sourcing $I_{src}$, and current sinking $I_{snk}$ for the base current supplied to or generated from common emitter transistor Q0'. The buffer amplifier 610 may be considered as a beta helper for common-emitter transistor Q0'.

The inventors of the present disclosure have appreciated that by including the buffer amplifier 610 with both current sourcing and current sinking capability in the bias circuit 630, a low-impedance voltage output at the base of first bias transistor QB15 may be provided under all operating conditions. Furthermore, since any avalanche current generated by CE transistor Q0' may flow to the common supply rail 604 via the buffer amplifier 610, the risk of failure of the device may be reduced.

Figure 9:
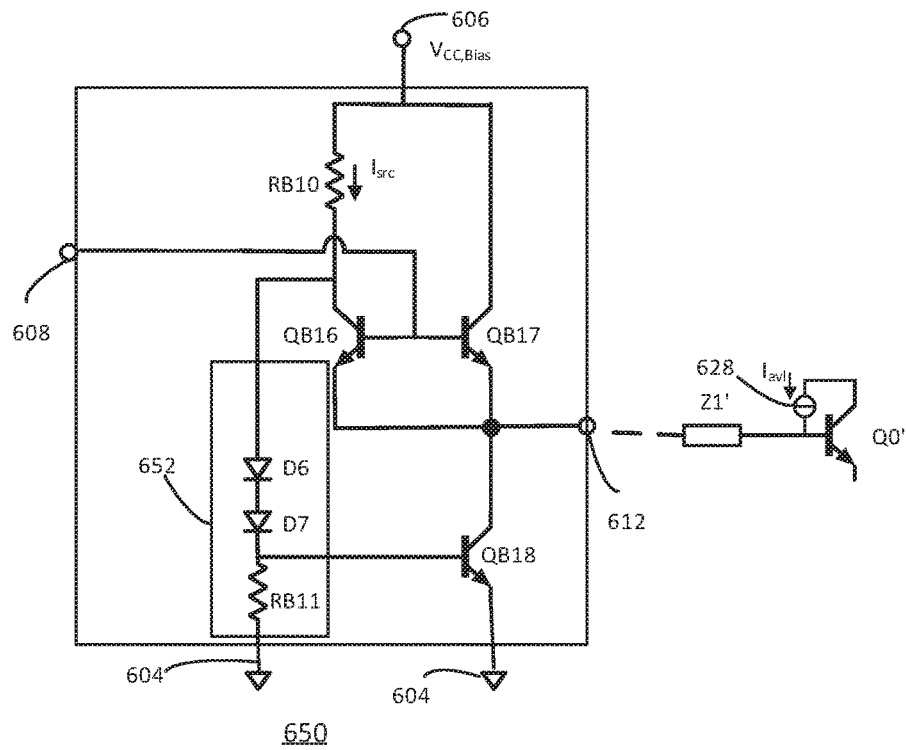
FIG. 9 illustrates a buffer amplifier for an RF bipolar amplifier bias circuit according to an embodiment.

FIG. 9 shows an example buffer amplifier 650 which may be used instead of buffer amplifier 610 in the bias circuit 630. The transistors illustrated in FIG. 9 are NPN bipolar transistors. Other examples may use PNP transistors or a mix of PNP and NPN bipolar transistors.

The buffer amplifier 650 may include a current sourcing transistor QB17, a current sinking transistor QB18, a level shifter 652, an input transistor QB16 and a current source resistor RB10.

The input transistor QB16 may have a collector connected to a first terminal of the current source resistor RB10. A second terminal of the current source resistor RB10 may be connected to the bias supply rail 606. The input transistor QB16 may have an emitter connected to the buffer amplifier output 612. The input transistor QB17 may have a base connected to the buffer amplifier input 608.

The current sourcing transistor QB17 may have a collector connected to the bias supply rail 606. The current sourcing transistor QB17 may have an emitter connected to the buffer amplifier output 612. The current sourcing transistor QB17 may have a base connected to the buffer amplifier input 608.

The current sinking transistor QB18 may have a collector connected to the buffer amplifier output 612. The current sinking transistor QB18 may have an emitter connected to the common supply rail 604.

The level shifter 652 may include a series arrangement of diode D6, diode D7 and level shifter resistor RB11 connected between the collector of the input transistor QB17 and the common supply rail 604. The common node between diode D7 and the level shifter resistor RB11 may be connected to the base of the current sinking transistor QB18.

In operation, the bias supply rail may supply a voltage denoted $V_{CC,Bias}$. The current source resistor RB10 may supply a current $I_{src}$. If avalanche current $I_{avl}$ illustrated as current source 628 is generated by CE transistor Q0', this may flow into the bias network from CE transistor Q0' and impedance element Z1' into the buffer amplifier 650 via buffer amplifier output 612. The avalanche current $I_{avl}$ may decrease the collector current in input transistor QB16 by an amount $I_{src}-I_{avl}$. The decrease in collector current results in an increase of the collector voltage of input transistor QB16. Via level shift 652, the base-emitter voltage of current sinking transistor QB18 may increases and sinks the net base current of CE transistor Q0' to the common supply rail 604 which may be ground. By sinking the net base current, the base bias voltage of CE transistor Q0' may be stabilized.

The forward base-current of common emitter transistor Q0' may be provided by input transistor QB16 and current sourcing transistor QB17. The forward base current provided may by higher than $I_{src}$ since current sourcing transistor QB17 is not limited by the current source resistor RB10.

In other examples, it will be appreciated that any of the buffer amplifiers 200, 250, 300, 350 may be used to replace buffer amplifier 610 in the RF amplifier 600.

Figure 10:
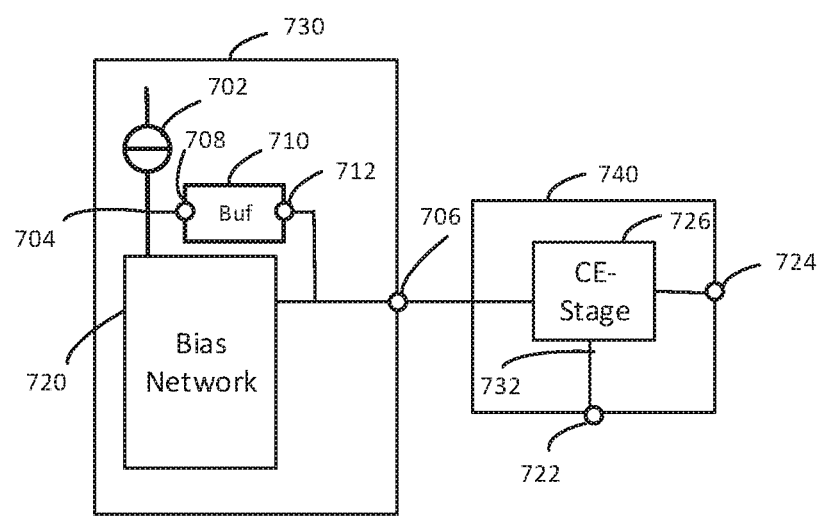
FIG. 10 shows an RF bipolar amplifier including a bias circuit according to an embodiment.

FIG. 10 shows an RF bipolar amplifier 700 according to an embodiment. RF amplifier includes a bias circuit 730 and an RF cascode amplifier circuit 740.

The bias circuit 730 includes a cascode bias network 720, a buffer amplifier 710 and a current source 702. The current source 702 may have a connection 704 to the cascode bias network 720. The current source 702 may have a connection 704 to the buffer amplifier input 708. The buffer amplifier output 712 may be connected to a first bias terminal 706. The bias network 720 may be connected to the first bias terminal 706

The RF amplifier circuit 740 may include a common-emitter stage 726 including one or more bipolar transistors in a common-emitter configuration. The common-emitter stage 726 may be connected to the RF amplifier output 724. The common-emitter stage 726 may be connected to the RF amplifier input 722.

The first bias terminal 706 may be connected to one or more of the bases of the transistors in the common-emitter stage 726.

In operation, the bias network 720 may supply the base current for the transistors in the common-emitter stage 726 via first bias terminal 706. The buffer amplifier 710 may provide additional base current to the common-emitter stage 726. The buffer amplifier 710 may sink avalanche current generated from the common-emitter stage 726. The buffer amplifier 710 may source and sink base currents to and from the common-emitter stage 726 in the presence of avalanche currents under nominal and extreme loading conditions. Consequently, the buffer amplifier 710 may stabilize the bias supply to the RF amplifier circuit 740 and prevent the common-emitter stage 726 from breakdown.

It will be appreciated that the buffer amplifier 710 may be implemented by any of the buffer amplifiers 200, 250, 300, 350, 400, 650.

The embodiments herein describe a bias circuit including a buffer amplifier which may act as a beta-helper circuit for a common-base transistor in the cascode of an RF amplifier. The buffer amplifier may allow additional base current sourcing when required by the common-base stage.

The buffer amplifier may allow more efficient avalanche current sinking. By improving the avalanche current sinking the possibility of damage occurring to the RF power amplifier during operation due to, for example, a mismatched load impedance based on VSWR requirements, may be reduced. Furthermore, the bias circuit may include a cascode configuration to supply bias currents to a common-base stage and a common-emitter stage.

Embodiments herein further describe a bias circuit including a buffer amplifier which may act as a beta-helper circuit for a common-emitter stage of a common-emitter RF amplifier. The buffer amplifier may allow additional base current sourcing when required by the common-emitter stage. The buffer amplifier may allow more efficient avalanche current sinking. By improving the avalanche current sinking the possibility of damage occurring to the RF power amplifier during operation due to, for example, a mismatched load impedance based on VSWR requirements, may be reduced.

The term current sourcing transistor as used herein refers to a transistor where current is flowing out of the device. A current sourcing transistor may provide current to the base of the transistors in the amplifier circuits. The term current sinking transistor as used herein refers to a transistor where current is flowing into the device. A current sinking transistor may sink current from the base of the transistors in the amplifier circuits.

A bias circuit for a bipolar RF amplifier is described. The bias circuit includes a current source coupled to a bias network. The bias network supplies a base current to the transistors in the amplifier circuit of the bipolar RF amplifier. The bias circuit includes a buffer coupled to the bias network and to the bipolar RF amplifier circuit. The buffer provides additional base current to the amplifier circuit of the bipolar RF amplifier and sinks avalanche current generated by the amplifier circuit of the bipolar RF amplifier.

Embodiments of the bias circuit described may be included in any amplifier using bipolar transistors. The bias circuit may for example be used for amplifiers required to amplify signals to high-power levels for the transmission of radio signals. High power levels may be in a range from 10 mWatts to several Watts of power. For example, the bias circuit may be included in power amplifiers for wireless applications, such as for example 5G mmWave products or cellular mobile products.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub combination.

The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

The invention claimed is:

1. A bias circuit for an RF bipolar amplifier, the bias circuit comprising:
    a first bias circuit terminal configured to be coupled to the base of a transistor in the RF bipolar amplifier;
    a current source;
    a bias network coupled to the current source and the first bias terminal; and
    a buffer amplifier having an input coupled to the current source and an output coupled to the first bias circuit terminal; wherein the buffer amplifier is configured to at least partially source current provided to the first bias circuit terminal and to sink current from the first bias circuit terminal; and wherein the bias network is configured to provide a current to the first bias circuit terminal, wherein the buffer amplifier comprises:
  a current sourcing transistor having a base coupled to the buffer amplifier input and an emitter coupled to the buffer amplifier output,
  a current sink arranged between the buffer amplifier output and common supply rail.

2. A bias circuit for an RF bipolar amplifier, the bias circuit comprising:
  a first bias circuit terminal configured to be coupled to the base of a transistor in the RF bipolar amplifier;
  a current source;
  a bias network coupled to the current source and the first bias terminal; and
  a buffer amplifier having an input coupled to the current source and an output coupled to the first bias circuit terminal; wherein the buffer amplifier is configured to at least partially source current provided to the first bias circuit terminal and to sink current from the first bias circuit terminal; and wherein the bias network is configured to provide a current to the first bias circuit terminal;
  a second bias terminal coupled to the bias network, wherein the first bias circuit terminal is configured to be coupled to the base of a common-base transistor of a RF bipolar amplifier and the second bias circuit terminal is configured to be coupled to the base of a common-emitter transistor of the RF bipolar amplifier and wherein the bias network is configured to provide a current to the second bias circuit terminal.

3. The bias circuit of claim 2 wherein the bias network comprises:
  a first bias transistor, a second bias transistor, and a third bias transistor, wherein the
  first bias transistor and third bias transistor is arranged in a cascode stack between a bias supply voltage rail and a common supply rail, the first bias transistor having a base coupled to the first bias circuit terminal and the third bias transistor having a base coupled to the second bias circuit terminal; and
  the second bias transistor having a base coupled to the first bias transistor base, an emitter coupled to the third bias transistor base and the common supply rail, and a collector coupled to the current source.

4. The bias circuit of claim 3 further comprising a first bias resistor arranged between the third bias transistor base and the second bias circuit terminal and a series arrangement of a second bias resistor and a third bias resistor arranged between the third bias transistor emitter and the common supply rail wherein the third bias transistor base is coupled to a common node between the second bias resistor and the third bias resistor.

5. A bias circuit for an RF bipolar amplifier, the bias circuit comprising:
  a first bias circuit terminal configured to be coupled to the base of a transistor in the RF bipolar amplifier;
  a current source;
  a bias network coupled to the current source and the first bias terminal; and
  a buffer amplifier having an input coupled to the current source and an output coupled to the first bias circuit terminal; wherein the buffer amplifier is configured to at least partially source current provided to the first bias circuit terminal and to sink current from the first bias circuit terminal; and wherein the bias network is configured to provide a current to the first bias circuit terminal;
  wherein the bias network comprises a bias transistor having a collector coupled to the current source and the buffer amplifier input, an emitter coupled to the common supply rail, a bias resistor arranged between the bias transistor base and the first bias terminal, and a capacitor arranged between the bias transistor collector and the bias transistor base.

6. The bias circuit of claim 5 wherein the buffer amplifier comprises:
  a current sourcing transistor having a base coupled to the buffer amplifier input and an emitter coupled to the buffer amplifier output,
  a current sink arranged between the buffer amplifier output and common supply rail.

7. The bias circuit of claim 1 wherein the buffer amplifier further comprises a level shifter having a first terminal coupled to the current sourcing transistor collector and wherein the current sink comprises a current sinking transistor having a base coupled to a second terminal of the level shifter, a collector coupled to the first bias transistor base and an emitter coupled to the common supply rail.

8. The bias circuit of claim 7 wherein the level shifter comprises a series arrangement of at least two diodes and a resistor coupled between current sourcing transistor collector and the common supply rail, and wherein the current sinking transistor base is coupled to a common node of one of the at least two diodes and the resistor.

9. The bias circuit of claim 7 wherein the buffer amplifier further comprises a current source element arranged between the bias supply voltage rail and the current sourcing transistor collector.

10. The bias circuit of claim 9 wherein the current source element comprises a resistor.

11. The bias circuit of claim 9, wherein the buffer amplifier further comprises a clamp transistor arranged in parallel with the current source element.

12. The bias circuit of claim 1 wherein the buffer amplifier comprises a class AB amplifier.

13. A bias circuit for an RF bipolar amplifier, the bias circuit comprising:
  a first bias circuit terminal configured to be coupled to the base of a transistor in the RF bipolar amplifier;
  a current source;
  a bias network coupled to the current source and the first bias terminal; and
  a buffer amplifier having an input coupled to the current source and an output coupled to the first bias circuit terminal; wherein the buffer amplifier is configured to at least partially source current provided to the first bias circuit terminal and to sink current from the first bias circuit terminal; and wherein the bias network is configured to provide a current to the first bias circuit terminal;
  wherein the buffer amplifier comprises:
    an output stage including a series arrangement of a current sourcing transistor and a current sinking transistor between the bias supply voltage rail and the common supply rail;
    a series arrangement of an input transistor and a level-shift diode between the bias supply voltage rail and the current sink transistor;
    wherein the first bias transistor base is coupled to the current sourcing transistor emitter and the current sinking transistor emitter, and the first bias transistor collector is coupled to the current sourcing transistor base and the input transistor base.

14. A bipolar RF amplifier comprising the bias circuit of claim 1 coupled to an amplifier circuit.

15. The bipolar RF amplifier of claim 14 wherein the amplifier circuit comprises:
   a cascode arrangement of a common base stage, and a common emitter stage;
   an input coupled to the common emitter stage;
   an output coupled to the common base stage.

16. The A bipolar RF amplifier comprising:
   a bias circuit comprising:
      a first bias circuit terminal configured to be coupled to the base of a transistor in the RF bipolar amplifier;
      a current source;
      a bias network coupled to the current source and the first bias terminal; and
      a buffer amplifier having an input coupled to the current source and an output coupled to the first bias circuit terminal; wherein the buffer amplifier is configured to at least partially source current provided to the first bias circuit terminal and to sink current from the first bias circuit terminal; and wherein the bias network is configured to provide a current to the first bias circuit terminal;
   wherein the bias circuit further comprises a second bias terminal coupled to the bias network, wherein the first bias circuit terminal is configured to be coupled to the base of a common-base transistor of a RF bipolar amplifier and the second bias circuit terminal is configured to be coupled to the base of a common-emitter transistor of the RF bipolar amplifier and wherein the bias network is configured to provide a current to the second bias circuit terminal.

17. The bias circuit of claim 2 wherein the buffer amplifier comprises:
   a current sourcing transistor having a base coupled to the buffer amplifier input and an emitter coupled to the buffer amplifier output,
   a current sink arranged between the buffer amplifier output and common supply rail.

18. The bias circuit of claim 2 wherein the buffer amplifier comprises:
   an output stage including a series arrangement of a current sourcing transistor and a current sinking transistor between the bias supply voltage rail and the common supply rail;
   a series arrangement of an input transistor and a level-shift diode between the bias supply voltage rail and the current sink transistor;
   wherein the first bias transistor base is coupled to the current sourcing transistor emitter and the current sinking transistor emitter, and the first bias transistor collector is coupled to the current sourcing transistor base and the input transistor base.

19. The bias circuit of claim 8 wherein the buffer amplifier further comprises a current source element arranged between the bias supply voltage rail and the current sourcing transistor collector.

20. The bias circuit of claim 10, wherein the buffer amplifier further comprises a clamp transistor arranged in parallel with the current source element.

* * * * *